United States Patent
Hu et al.

(10) Patent No.: US 10,217,798 B2
(45) Date of Patent: Feb. 26, 2019

(54) SYSTEMS AND METHODS FOR IMPLEMENTING SELECT DEVICES CONSTRUCTED FROM 2D MATERIALS

(71) Applicant: Inston, Inc., Santa Monica, CA (US)

(72) Inventors: Qi Hu, Cypress, CA (US); Kang L. Wang, Santa Monica, CA (US)

(73) Assignee: Inston, Inc., Santa Monica, CA (US)

(*) Notice: Subject to any disclaimer, the term of this patent is extended or adjusted under 35 U.S.C. 154(b) by 0 days.

(21) Appl. No.: 14/995,046

(22) Filed: Jan. 13, 2016

(65) Prior Publication Data

US 2016/0204162 A1 Jul. 14, 2016

Related U.S. Application Data

(60) Provisional application No. 62/102,995, filed on Jan. 13, 2015.

(51) Int. Cl.
| | |
|---|---|
| *H01L 27/24* | (2006.01) |
| *H01L 29/872* | (2006.01) |
| *H01L 29/24* | (2006.01) |
| *H01L 29/786* | (2006.01) |
| *H01L 29/16* | (2006.01) |

(Continued)

(52) U.S. Cl.
CPC ........ *H01L 27/2436* (2013.01); *H01L 27/224* (2013.01); *H01L 27/228* (2013.01); *H01L 27/2409* (2013.01); *H01L 27/2481* (2013.01); *H01L 29/1606* (2013.01); *H01L 29/24* (2013.01); *H01L 29/78603* (2013.01); *H01L 29/78648* (2013.01); *H01L 29/78681* (2013.01);

(Continued)

(58) Field of Classification Search
CPC . H01L 27/2436; H01L 27/224; H01L 27/228; H01L 27/2409; H01L 27/2481; H01L 29/1606; H01L 29/24; H01L 29/78696; H01L 29/8611; H01L 29/872; H01L 29/861
USPC .............................. 257/5, 29, 427
See application file for complete search history.

(56) References Cited

U.S. PATENT DOCUMENTS

| | | |
|---|---|---|
| 4,038,596 A | 7/1977 | Lee |
| 6,040,996 A | 3/2000 | Kong |

(Continued)

FOREIGN PATENT DOCUMENTS

| | | |
|---|---|---|
| WO | 2012159078 A2 | 11/2012 |
| WO | 2012159078 A3 | 3/2013 |

OTHER PUBLICATIONS

Akinwande, D. et al., "Two-dimensional flexible nanoelectronics", Nature Communications, vol. 5, 2014.

(Continued)

*Primary Examiner* — Cuong Q Nguyen
*Assistant Examiner* — Tong-Ho Kim
(74) *Attorney, Agent, or Firm* — KPPB LLP

(57) ABSTRACT

Systems and methods in accordance with embodiments of the invention implement select devices constructed from 2D materials. In one embodiment, a crossbar memory system includes: a first set of connection lines; a second set of connection lines; and an array of memory cells, each memory cell including: a select device; and a memory device; where each memory cell is coupled to a unique combination of: at least one connection line from the first set of connection lines, and at least one connection line from the second set of connection lines; and where at least one select device includes a 2D material.

14 Claims, 12 Drawing Sheets

(51) Int. Cl.
  *H01L 27/22* (2006.01)
  *H01L 29/861* (2006.01)
(52) U.S. Cl.
  CPC ...... *H01L 29/78696* (2013.01); *H01L 29/861* (2013.01); *H01L 29/872* (2013.01)

(56) References Cited

U.S. PATENT DOCUMENTS

| | | | |
|---|---|---|---|
| 6,114,719 | A | 9/2000 | Dill et al. |
| 6,292,395 | B1 | 9/2001 | Lin et al. |
| 6,529,412 | B1 | 3/2003 | Chen et al. |
| 6,791,897 | B2 | 9/2004 | Choi et al. |
| 7,057,921 | B2 | 6/2006 | Valet et al. |
| 7,282,755 | B2 | 10/2007 | Pakala et al. |
| 7,403,442 | B2 | 7/2008 | Larguier et al. |
| 7,480,172 | B2 | 1/2009 | Shi et al. |
| 8,213,234 | B2 | 7/2012 | Chen et al. |
| 8,482,968 | B2 | 7/2013 | Worledge et al. |
| 8,760,930 | B1 | 6/2014 | Kushnarenko et al. |
| 8,804,425 | B2 | 8/2014 | Chen et al. |
| 8,841,739 | B2 | 9/2014 | Amiri et al. |
| 8,885,395 | B2 | 11/2014 | Malmhall et al. |
| 8,891,291 | B2 | 11/2014 | Huai et al. |
| 9,099,641 | B2 | 8/2015 | Amiri et al. |
| 9,129,691 | B2 | 9/2015 | Amiri et al. |
| 9,240,799 | B1 | 1/2016 | Wang et al. |
| 9,324,403 | B2 | 4/2016 | Amiri et al. |
| 9,355,699 | B2 | 5/2016 | Amiri et al. |
| 9,361,975 | B2 | 6/2016 | Gilbert et al. |
| 2002/0057594 | A1 | 5/2002 | Hirai |
| 2004/0241394 | A1 | 12/2004 | Burrows |
| 2005/0036361 | A1 | 2/2005 | Fukuzumi et al. |
| 2005/0062082 | A1* | 3/2005 | Bucher ............ H01L 29/26 257/288 |
| 2006/0133137 | A1 | 6/2006 | Shin et al. |
| 2006/0239110 | A1 | 10/2006 | Ueda et al. |
| 2007/0183190 | A1 | 8/2007 | Eyckmans et al. |
| 2009/0046529 | A1 | 2/2009 | Chen et al. |
| 2010/0080048 | A1 | 4/2010 | Liu et al. |
| 2010/0155687 | A1* | 6/2010 | Reyes ............ H01L 45/04 257/4 |
| 2010/0277974 | A1 | 11/2010 | Yang |
| 2011/0051502 | A1 | 3/2011 | Rao et al. |
| 2011/0260224 | A1 | 10/2011 | Hidaka |
| 2012/0176831 | A1* | 7/2012 | Xiao ............ G11C 13/0007 365/148 |
| 2013/0015542 | A1 | 1/2013 | Wang et al. |
| 2013/0200323 | A1* | 8/2013 | Pham ............ H01L 45/1608 257/4 |
| 2013/0343117 | A1 | 12/2013 | Lua et al. |
| 2014/0070344 | A1 | 3/2014 | Amiri et al. |
| 2014/0071728 | A1 | 3/2014 | Khalili et al. |
| 2014/0071732 | A1 | 3/2014 | Khalili et al. |
| 2014/0124882 | A1 | 5/2014 | Amiri et al. |
| 2014/0159121 | A1 | 6/2014 | Fukami et al. |
| 2014/0169085 | A1 | 6/2014 | Wang et al. |
| 2014/0177327 | A1 | 6/2014 | Khalili et al. |
| 2014/0197459 | A1* | 7/2014 | Kis ............ H01L 29/66742 257/194 |
| 2014/0247653 | A1 | 9/2014 | Wang et al. |
| 2014/0334216 | A1 | 11/2014 | Wang et al. |
| 2015/0064492 | A1 | 3/2015 | Rasic et al. |
| 2015/0122315 | A1* | 5/2015 | Shin ............ H01L 29/73 136/255 |
| 2015/0137289 | A1 | 5/2015 | Khalili |
| 2015/0249096 | A1* | 9/2015 | Lupino ............ H01L 27/11898 257/203 |
| 2015/0332749 | A1 | 11/2015 | Khalili et al. |
| 2016/0027842 | A1 | 1/2016 | Khalili et al. |
| 2016/0197263 | A1 | 7/2016 | Hu |
| 2016/0240771 | A1 | 8/2016 | Hu |
| 2016/0358973 | A1 | 12/2016 | Katine et al. |
| 2017/0033281 | A1 | 2/2017 | Hu |
| 2017/0084322 | A1 | 3/2017 | Wang et al. |
| 2017/0092842 | A1 | 3/2017 | Khalili Amiri et al. |
| 2017/0178705 | A1 | 6/2017 | Buhrman et al. |
| 2017/0323929 | A1* | 11/2017 | Bessonov ............ H01L 27/2409 |

OTHER PUBLICATIONS

Bae, S. et al., "Roll-to-roll production of 30-inch graphene films for transparent electrodes", Nature Nanotechnology, vol. 5, 2010, pp. 574-578.
Britnell, L. et al., "Resonant tunnelling and negative differential conductance in graphene transistors", Nature Communications, vol. 4, 2013, p. 1794.
Britnell, L. et al., "Strong Light-Matter Interactions in Heterostructures of Atomically Thin Films", Science, vol. 340, Jun. 14, 2013, pp. 1311-1314.
Buscema, M. et al., "Photovoltaic effect in few-layer black phosphorus PN junctions defined by local electrostatic gating", Nature Communications., vol. 5, 2014, p. 4651.
Butler, S. Z. et al., "Progress, Challenges, and Opportunities in Two-Dimensional Materials Beyond Graphene", ACS Nano, vol. 7, Apr. 23, 2013, pp. 2898-2926.
Choi, M. S. et al., "Lateral MoS2 p-n Junction Formed by Chemical Doping for Use in High-Performance Optoelectronics", ACS Nano, vol. 8, Sep. 23, 2014, pp. 9332-9340.
Dorrance, R. et al., "Diode-MTJ Crossbar Memory Cell Using Voltage-Induced Unipolar Switching for High-Density MRAM", Electron Device Letters, IEEE, vol. 34, 2013, pp. 753-755.
Furchi, M. M. et al., "Photovoltaic Effect in an Electrically Tunable van der Waals Heterojunction", Nano Letters, vol. 14, Aug. 13, 2014, pp. 4785-4791.
Geim, A. K. et al., "Van der Waals heterostructures", Nature, vol. 499, 2013, pp. 419-425.
Georgiou, T. et al., "Vertical field-effect transistor based on graphene-WS2 heterostructures for flexible and transparent electronics", Nature Nanotechnology, vol. 8, 2013, pp. 100-103.
Haigh, S. J., "Cross-sectional imaging of individual layers and buried interfaces of graphene-based heterostructures and superlattices", Nature Materials, vol. 11, 2012, pp. 764-767.
Heub, S. Y., "Bidirectional Two-Terminal Switching Device for Crossbar Array Architecture", Electron Device Letters, IEEE, vol. 32, 2011, pp. 1023-1025.
Huang, J.-K. et al., "Large-Area Synthesis of Highly Crystalline WSe2 Monolayers and Device Applications", ACS Nano, vol. 8, Jan. 28, 2014, pp. 923-930.
Jariwala, D. et al., "Emerging Device Applications for Semiconducting Two-Dimensional Transition Metal Dichalcogenides", ACS Nano, vol. 8, Feb. 25, 2014, pp. 1102-1120.
Kobayashi, T. et al., "Production of a 100-m-long high-quality graphene transparent conductive film by roll-to-roll chemical vapor deposition and transfer process", Applied Physics Letters, vol. 102, 2013.
Lee, C.-H. et al., "Atomically thin p-n junctions with van der Waals heterointerfaces", Nature Nanotechnology, vol. 9, 2014, pp. 676-681.
Lee, G.-H. et al., "Flexible and Transparent MoS2 Field-Effect Transistors on Hexagonal Boron Nitride-Graphene Heterostructures", ACS Nano, vol. 7, Sep. 24, 2013, pp. 7931-7936.
Lee, Y.-H. et al., "Synthesis of Large-Area MoS2 Atomic Layers with Chemical Vapor Deposition", Advanced Materials, vol. 24, 2012, pp. 2320-2325.
Li, L. et al., "Black phosphorus field-effect transistors", Nature Nanotechnology, vol. 9, 2014, pp. 372-377.
Lin, Y.-M. et al., "Wafer-Scale Graphene Integrated Circuit", Science, vol. 332, Jun. 10, 2011, pp. 1294-1297.
Liu, W. et al., "Role of Metal Contacts in Designing High-Performance Monolayer n-Type WSe2 Field Effect Transistors", Nano Letters, vol. 13, May 8, 2013, pp. 1983-1990.
Liu, Leitao et al., "On Monolayer MoS2 Field-Effect Transistors at the Scaling Limit", IEEE Transactions on Electron Devices, vol. 60, No. 12, Dec. 2013, pp. 4133-4139.
Miro, P. et al., "An atlas of two-dimensional materials", Chemical Society Reviews, vol. 43, 2014, pp. 6537-6554.

(56) References Cited

OTHER PUBLICATIONS

Novoselov, K. S. et al., "Electric Field Effect in Atomically Thin Carbon Films", Science, vol. 306, 2004, pp. 666-669.
Pospischil, A. et al., "Solar-energy conversion and light emission in an atomic monolayer p-n diode", Nature Nanotechnology, vol. 9, 2014, pp. 257-261.
Radisavljevic, B. et al., "Single-Layer MoS2 Transistors", Nature Nanotechnology, vol. 6, 2011, pp. 147-150.
Roy, T. et al., "Field-Effect Transistors Built from All Two-Dimensional Material Components", ACS Nano, vol. 8, Jun. 24, 2014, pp. 6259-6264.
Tian, H. et al., "Novel Field-Effect Schottky Barrier Transistors Based on Graphene-MoS2 Heterojunctions", Scientific Reports, vol. 4, 2014.
Wang, H. et al., "Integrated Circuits Based on Bilayer MoS2 Transistors", Nano Letters., vol. 12, Sep. 12, 2012, pp. 4674-4680.
Wang, Q. H. et al., "Electronics and optoelectronics of two-dimensional transition metal dichalcogenides", Nature Nanotechnology, vol. 7, 2012, pp. 699-712.
Wang, X. et al., "Chemical Vapor Deposition Growth of Crystalline Monolayer MoSe2", ACS Nano, vol. 8, May 27, 2014, pp. 5125-5131.
Yu, W. J. et al., "Highly efficient gatetunable photocurrent generation in vertical heterostructures of layered materials", Nature Nanotechnology, vol. 8, 2013, pp. 952-958.
Yu, W. J. et al., "Vertically stacked multi-heterostructures of layered materials for logic transistors and complementary inverters", Nature Materials, vol. 12, 2013, pp. 246-252.
Zhan, Y. et al., "Large-Area Vapor-Phase Growth and Characterization of MoS2 Atomic Layers on a SiO2 Substrate", Small, vol. 8, 2012, pp. 966-971.
Zhang, Y. et al., "Controlled Growth of High-Quality Monolayer WS2 Layers on Sapphire and Imaging Its Grain Boundary", ACS Nano, vol. 7, Oct. 22, 2013, pp. 8963-8971.
International Search Report and Written Opinion for International Application No. PCT/US2017/039832, Search completed Aug. 8, 2017, dated Aug. 29, 2017, 6 Pgs.
International Search Report and Written Opinion for International Application No. PCT/US2017/039833, Search completed Aug. 22, 2017, dated Sep. 6, 2017, 22 Pgs.
Alzate et al., "Voltage-Induced Switching of CoFeB—MgO Magnetic Tunnel Junctions", 56th Conference on Magnetism and Magnetic Materials, Scottsdale, Arizona, USA, EG-11 (2011), 1 pg.
Alzate et al., "Voltage-induced switching of nanoscale magnetic tunnel junctions", Conference Paper in Electron Devices Meeting, 1988. IEDM '88. Technical Digest, International, Jan. 2012, 29.5.1-29.5.4.
Amiri et al., "Electric-Field-Controlled Magnetoelectric RAM: Progress, Challenges, and Scaling", IEEE Transactions on Magnetics, Nov. 2015, vol. 51, No. 11, 7 pgs.
Amiri et al., "Electric-field-induced thermally assisted switching of monodomain magnetic bits", Journal of Applied Physics, Jan. 7, 2013, vol. 113. pp. 013912-1-013912-5.
Amiri et al., "Switching current reduction using perpendicular anisotropy in CoFeB—MgO magnetic tunnel junctions", Applied Physics Letters, Mar. 17, 2011, vol. 98, pp. 112507-1-112507-3.
Amiri et al., "Voltage-Controlled Magnetic Anisotropy in Spintronic Devices", SPIN, Oct. 29, 2012, vol. 2, No. 3, pp. 1240002-1-1240002-9.
Brown, "Thermal Fluctuations of a Single-Domain Particle", Physical Review, Jun. 1, 1963, vol. 130, No. 5, pp. 1677-1686.
Chang et al., "A 0.5V 4Mb Logic-Process compatible Embedded Resistive Ram (ReRAM) in 65nm CMOS Using Low-voltage Current-Mode Sensing Scheme with 45ns Random Read Time", 2012 IEEE International Solid-State Circuits Conference, ISSCC 2012, Feb. 22, 2012, pp. 434-436.
Chatterjee et al., "Dual-Source-Line-Bias Scheme to Improve the Read Margin and Sensing Accuracy of STTRAM in Sub-90-nm Nodes", IEEE Transactions on Circuits and Systems—II: Express Briefs, Mar. 8, 2010, vol. 57, No. 3, pp. 208-212.
Chen et al., "A 40 nm fully Functional SRAM with BL Swing and WL Pulse Measurement Scheme for Eliminating a Need for Additional Sensing Tolerance Margins", 2011 Symposium on VLSI Circuits Digest of Technical Papers, Jun. 15-17, 2011, pp. 70-71.
Chen et al., "Compact Measurement Schemes for Bit-Line Swing, Sense Amplifier Offset Voltage, and Word-Line Pulse Width to Characterize Sensing Tolerance Margin in a 30 nm Fully Functional Embedded SRAM", IEEE Journal of Solid-State Circuits, Apr. 2012, vol. 47, No. 4, pp. 969-980.
Fukada et al., "Non-volatile Random Access Memory and NAND Flash Memory Integrated Solid-State Drives with Adaptive Codeword Error Correcting Code for 3.6 Times Acceptable Raw Bit Error Rate Enhancement and 97% Power Reduction", Japanese Journal of Applied Physics, Apr. 20, 2011, vol. 50, pp. 04DE09-1-04DE09-7.
Grezes et al., "Ultra-low switching energy and scaling in electric-field-controlled nanoscale magnetic tunnel junctions with high resistance-area product", Applied Physics Letters, 2016, vol. 108, pp. 012403-1-012403-5.
Halupka et al., "Negative-Resistance Read and Write Schemes for SST-MRAM in 0.13μm CMOS", 2010 IEEE International Solid-State Circuits Conference, ISSCC 2010, Feb. 9, 2010, pp. 256-258.
Huai et al., "Observation of spin-transfer switching in deep submicron-sized and low-resistance magnetic tunnel junctions", Applied Physics Letter, Apr. 19, 2004, vol. 84, No. 16, pp. 3118-3120.
Ikeda et al., "A perpendicular-anistropy CoFeB—MgO magnetic tunnel junction", Nature Materials, Sep. 2010 (published online Jul. 11, 2010), vol. 9, pp. 721-724.
Ikegami et al., "MTJ-Based "Normally-Off Processors" with Thermal Stability Factor Engineered Perpendicular MTJ, L2 Cache Based on 2T-2MTJ Cell, L3 and Last Level Cache Based on 1T-1MTJ Cell and Novel Error Handling Scheme", IEEE International Electron Devices Meeting (IEDM), Dec. 7-9, 2015, pp. 25.1.1-25.1.4.
Kalitsov et al., "Bias dependence of tunneling magnetoresistance in magnetic tunnel junctions with asymmetric barriers", Journal of Physics: Condensed Matter, Nov. 6, 2013, vol. 25, 496005, 8 pgs.
Kanai et al., "Electric field-induced magnetization reversal in a perpendicular-anisotropy CoFeB—MgO magnetic tunnel junction", Applied Physics Letters, Sep. 18, 2012, vol. 101, pp. 122403-1-122403-3.
Kanai et al., "Magnetization switching in a CoFeB/MgO magnetic tunnel junction by combining spin-transfer torque and electric field-effect", Applied Physics Letters, May 30, 2014, vol. 104, pp. 212406-1-212406-3.
Kang et al., "High-Speed, Low-Power, Magnetic Non-Volatile Flip-Flop with voltage-Controlled, Magnetic Anisotropy Assistance", IEEE Magnetics Letters, Nov. 8, 2016, vol. 7, 5 pgs.
Katine et al., "Current-Driven magnetization Reversal and Spin-Wave Excitations in Co/Cu/Co Pillars", Physical Review Letters, Apr. 3, 2000, vol. 84, No. 14, pp. 3149-3152.
Katine et al., "Device implications of spin-transfer torques", Journal of Magnetism and Magnetic Materials, Apr. 2008, vol. 320, pp. 1217-1226.
Kim et al., "Constant-Load Energy Recovery Memory for Efficient High-Speed Operation", International Symposium on Low Power Electronics and Design, ISLPED '04, Aug. 11, 2004, pp. 240-243.
Landau et al., "On the theory of the dispersion of magnetic permeability in ferromagnetic bodies", Ukr. J. Phys., 2008, vol. 53, Special Issue, pp. 14-22.
Lee et al., "A Word Line Pulse Circuit Technique for Reliable Magnetoelectric Random Access Memory", IEEE Transactions on Very Large Scale Integration (VLSI) Systems, Jul. 2017, vol. 25, No. 7, pp. 2027-2034.
Lee et al., "Design of a Fast and Low-Power Sense Amplifier and Writing Circuit for High-Speed MRAM", IEEE Transactions on Magnetics, May 2015, vol. 51, No. 5, 7 pgs.
Lee et al., "Low-Power, High-Density Spintronic Programmable Logic with Voltage-Gated Spin Hall Effect in Magnetic Tunnel Junctions", IEEE Magnetics Letters, May 4, 2016, vol. 7, 5 pgs.
Lee et al., "Source Line Sensing in Magneto-Electric Random-Access Memory to Reduce Read Disturbance and Improve Sensing Margin", IEEE Magnetics Letter, Jun. 20, 2016, vol. 7, 5 pgs.

(56) References Cited

OTHER PUBLICATIONS

Mandelman et al., "Challenges and future directions for the scaling of dynamic random-access Memory (DRAM)", IBM. F. Res & Dev, Mar./May 2002, vol. 46, No. 2/3, pp. 187-212.

Meng et al., "Electric field control of spin re-orientation in perpendicular magnetic tunnel junctions—CoFeB and MgO thickness dependence", Applied Physics Letters, Jul. 31, 2014, vol. 105, pp. 042410-1-042410-5.

Ong, P. et al., "Strain-induced Giant Magnetoelectric Effect in Heavy Metal/Magnet/Insulator Junctions", 59th Conference on Magnetism and Magnetic Materials, Honolulu, Hawaii, USA, EE-13 (2014), 2 pgs.

Ong et al., "Giant voltage modulation of magnetic anisotropy in strained heavy metal/magnet/insulator heterostructures", Physical Review B 92, 020407(R), Jul. 20, 2015, pp. 020407-1-020407-5.

Otsuka et al., "a 4Mb conductive-Bridge Resistive Memory with 2.3GB/s Read-Throughput and 216MB/s Program-Throughput", 2011 IEEE International Solid-State Circuits Conference, ISSCC2011, Feb. 22, 2011, pp. 210-211.

Qazi et al., "Challenges and Directions for Low-Voltage SRAM", IEEE Design & Test of Computers, Jan./Feb. 2011, pp. 32-43.

Rippard et al., "Thermal relaxation rates of magnetic nanoparticles in the presence of magnetic fields and spin-transfer effects", Physical Review B, Aug. 29, 2011, pp. 064439-1-064439-7.

Shamsi et al., "Reliable and High Performance STT-MRAM Architectures Based on Controllable-Polarity Devices", IEEE International Conference on Computer Design (ICCD), Oct. 18-21, 2015, pp. 343-350.

Shiota, Y. et al., "Induction of coherent magnetization switching in a few atomic layers of FeCo using voltage pulses", Nature Materials, published online Nov. 13, 2011, vol. 11, pp. 39-43.

Shiota et al., "Pulse voltage-induced dynamic magnetization switching in magnetic tunneling junctions with high resistance-area product", Applied Physics Letters, Sep. 5, 2012, vol. 101, pp. 102406-1-102406-4.

Tsuchida et al., "A 64Mb MRAM with Clamped-Reference and Adequate-Reference Schemes", IEEE International Solid-State Circuits Conference, ISSCC 2010/Session 14/ Non-Volatile Memory, Feb. 9, 2010, pp. 258-260.

Wang et al., "Comparative Evaluation of Spin-Transfer-Torque and Magnetoelectric Random Access Memory", IEEE Journal on Emerging and Selected Topics in Circuits and Systems, Jun. 2016, vol. 6, No. 2, pp. 134-145.

Wang et al., "Design and Implementation of Dynamic Word-Line Pulse Write Margin Monitor for SRAM", IEEE, Dec. 2-5, 2012, pp. 116-119.

Wang et al., "Electric-field-assisted switching in magnetic tunnel junctions", Nature Materials, published online Nov. 13, 2011, vol. 11, pp. 64-68.

Wang et al., "Low-power non-volatile spintronic memory: STT-RAM and beyond", J. Phys. D: Appl. Phys., Jan. 31, 2013, vol. 46, 10 pgs.

Wang et al., "Magnetoelectric Random Access Memory-Based Circuit Design by Using Voltage-Controlled Magnetic Anisotrophy in Magnetic Tunnel Junctions", IEEE Transactions on Nanotechnology, Nov. 2015, vol. 14, No. 6, pp. 992-997.

Worledge et al., "Spin torque switching of perpendicular Ta | CoFeB | MgO-based magnetic tunnel junctions", Applied Physics Letters, Jan. 10, 2011, vol. 98, pp. 022501-1-022501-3.

Yoshimoto et al., "A 40-nm 8T SRAM with Selective Source Line Control of Read Bitlines and Address Preset Structure", Published in Custom Integrated Circuits Conference (CICC), IEEE, Sep. 22-25, 2013, 4 pgs.

Emori et al., "Large voltage-induced modification of spin-orbit torques in Pt/Co/GdOx", Appl. Phys. Lett. 105, 222401 (2014).

Newhouse-Illige et al., "Voltage-controlled interlayer coupling in perpendicularly magnetized magnetic tunnel junctions", Nat. Commun. 8, 15232 doi: 10.1038/ncomms15232, Published May 16, 2017.

\* cited by examiner

SYSTEMS AND METHODS FOR IMPLEMENTING SELECT DEVICES CONSTRUCTED FROM 2D MATERIALS

CROSS-REFERENCE TO RELATED APPLICATIONS

The current application claims priority to U.S. Provisional Application No. 62/102,995, filed Jan. 13, 2015, the disclosure of which is incorporated herein by reference.

FIELD OF THE INVENTION

The present invention generally relates to the implementation of select devices constructed from 2D materials.

BACKGROUND OF THE INVENTION

Crossbar memory systems are well regarded for their practicable implementation of a relatively dense aggregation of memory bits. Typically, crossbar memory systems include an array of constituent 'memory cells,' which themselves typically include a two-terminal memory device in conjunction with a 'select device.' The memory devices typically operate to store information states (e.g. a first information state and a second information state, as in a conventional binary system). The select devices generally operate to facilitate the 'selection' of particular memory devices for reading/writing operations. For example, select devices can operate to: limit leakage paths, improve read characteristics, and/or improve memory device selection. Conventionally, select devices have been realized using diodes and/or transistors.

Crossbar memory systems also generally include two sets of connection lines (e.g. a set of bit lines and a set of word lines), that are typically overlaid such that they cross one another so as to form a grid-like pattern; the constituent memory cells are typically disposed at the intersecting points of the connection lines such that each memory cell is electrically coupled to a unique combination of two connection lines. In this way, each memory cell can be separately operated (e.g. via the respective unique combination of connection lines).

SUMMARY OF THE INVENTION

Systems and methods in accordance with embodiments of the invention implement select devices constructed from 2D materials. In one embodiment, a crossbar memory system includes: a first set of connection lines; a second set of connection lines; and an array of memory cells, each memory cell including: a select device; and a memory device; where each memory cell is coupled to a unique combination of: at least one connection line from the first set of connection lines, and at least one connection line from the second set of connection lines; and where at least one select device includes a 2D material.

In another embodiment, the at least one select device is a diode.

In yet another embodiment, the at least one select device is a schottky diode.

In still another embodiment, the at least one select device is a p-n diode.

In still yet another embodiment, the p-n diode includes a 2D material that is one of: graphene, $MoO_3$, $WO_3$, $MoS_2$, $MoSe_2$, $WS_2$, and $WSe_2$.

In a further embodiment, the p-n diode includes a van der Waals heterostructure and thereby includes a 2D material.

In a still further embodiment, the p-n diode includes p-type $WSe_2$ and n-type $MoS_2$.

In a yet further embodiment, every select device within the crossbar memory system includes a p-n diode.

In a still yet further embodiment, the memory device is one of: a resistive random-access memory device; a spin-transfer-torque random-access-memory device; and a magneto-electric random access memory device.

In another embodiment, the at least one select device is a transistor.

In yet another embodiment, the transistor includes a 2D material that is one of: graphene, $MoO_3$, $WO_3$, $MoS_2$, $MoSe_2$, $WS_2$, and $WSe_2$.

In still another embodiment, the transistor includes a 2D material that is $MoS_2$.

In still yet another embodiment, the transistor includes a van der Waals heterostructure and thereby includes a 2D material.

In a further embodiment, the transistor is immune to short-channel effects.

In a yet further embodiment, every select device within the crossbar memory system includes a transistor.

In a still further embodiment, the memory device is one of: a resistive random-access memory device; a spin-transfer-torque random-access-memory device; and a magneto-electric random access memory device.

In a still yet further embodiment, a stacked crossbar memory system includes: a first planar crossbar memory sub-system, itself including: a first set of connection lines; a second set of connection lines; and a first array of memory cells, each memory cell including: a select device; and a memory device; and where each memory cell is coupled to a unique combination of: at least one connection line from the first set of connection lines, and at least one connection line from the second set of connection lines; a second planar crossbar memory sub-system, itself including: a third set of connection lines; a fourth set of connection lines; and a second array of memory cells, each memory cell including: a select device; and a memory device; and where each memory cell is coupled to a unique combination of: at least one connection line from the third set of connection lines, and at least one connection line from the fourth set of connection lines; where the first planar crossbar memory sub-system and second planar crossbar memory sub-system are layered, one on top of the other, except that they are separated by an insulation layer; where at least one select device from at least one of the first array of memory cells and the second array of memory cells includes a 2D material.

In another embodiment, at least one select device from each of the first planar crossbar memory sub-system and the second planar crossbar memory sub-system includes a 2D material.

In still another embodiment, the at least one select device is a diode.

In yet another embodiment, the at least one select device is a transistor.

DETAILED DESCRIPTION

Figure 1A:
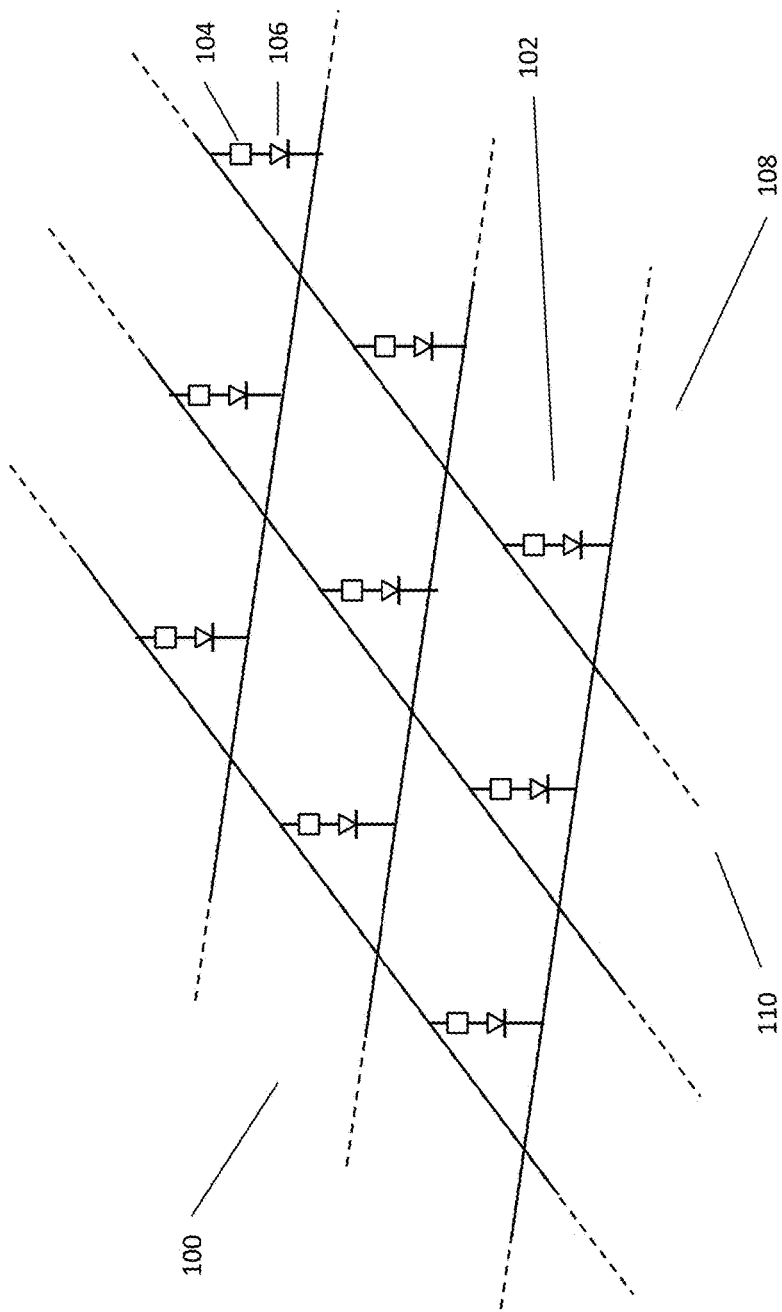
FIGS. 1A-1B illustrate a crossbar memory system utilizing conventional diodes as constituent select devices.
Figure 1B:
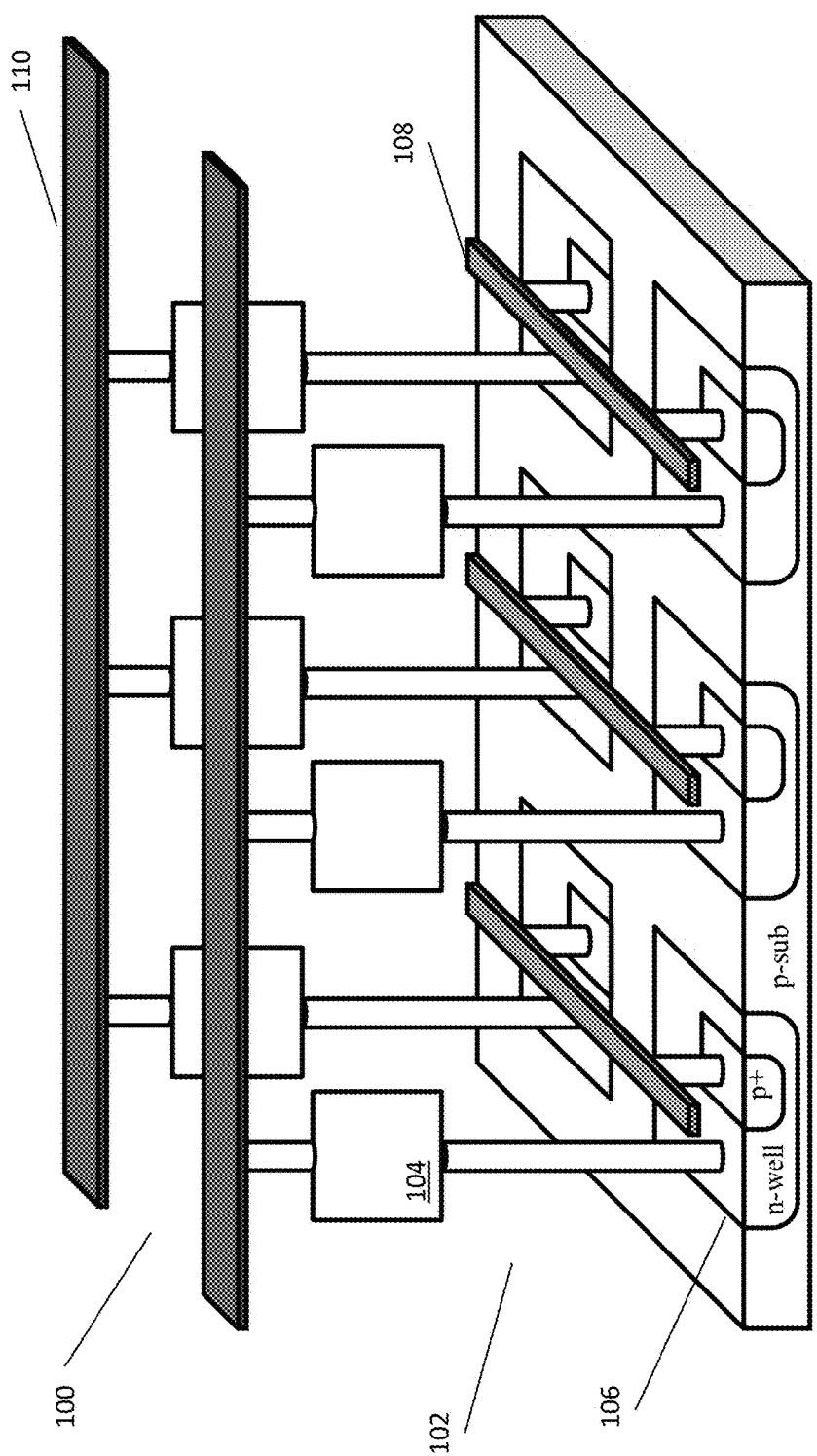

Turning now to the drawings, systems and methods for implementing select devices constructed from 2D materials are illustrated. Conventionally, select devices of crossbar memory systems have been implemented using standard CMOS technologies (which have overwhelmingly been a manufacturing technology of choice in the electronics industry); e.g. standard CMOS technologies have been used to create p-n diodes or metal-oxide-semiconductor field-effect transistors (MOSFETs) that can operate as select devices. For example, FIGS. 1A-1B illustrate a crossbar memory system that utilizes conventional select devices in the form of p-n diodes. In particular, FIG. 1A schematically illustrates that the crossbar memory architecture 100 includes an array of memory cells 102, each memory cell 102 including a constituent memory device 104 and a constituent select device 106. In the illustrated case, the select devices 106 are conventional diodes. It is further illustrated that the crossbar memory architecture includes a first set of connection lines 108 and a second set of connection lines 110 that are perpendicularly disposed; the memory cells 102 are located at the intersection of the perpendicularly disposed connection lines, 108 and 110. In this way, each memory cell 102 can be independently operated via a unique combination of respective connection lines. FIG. 1B depicts the crossbar memory system schematically illustrated in FIG. 1A. More particularly, FIG. 1B illustrates that the diode 106 seen in FIG. 1A is a conventionally-implemented p-n diode.

Figure 2A:
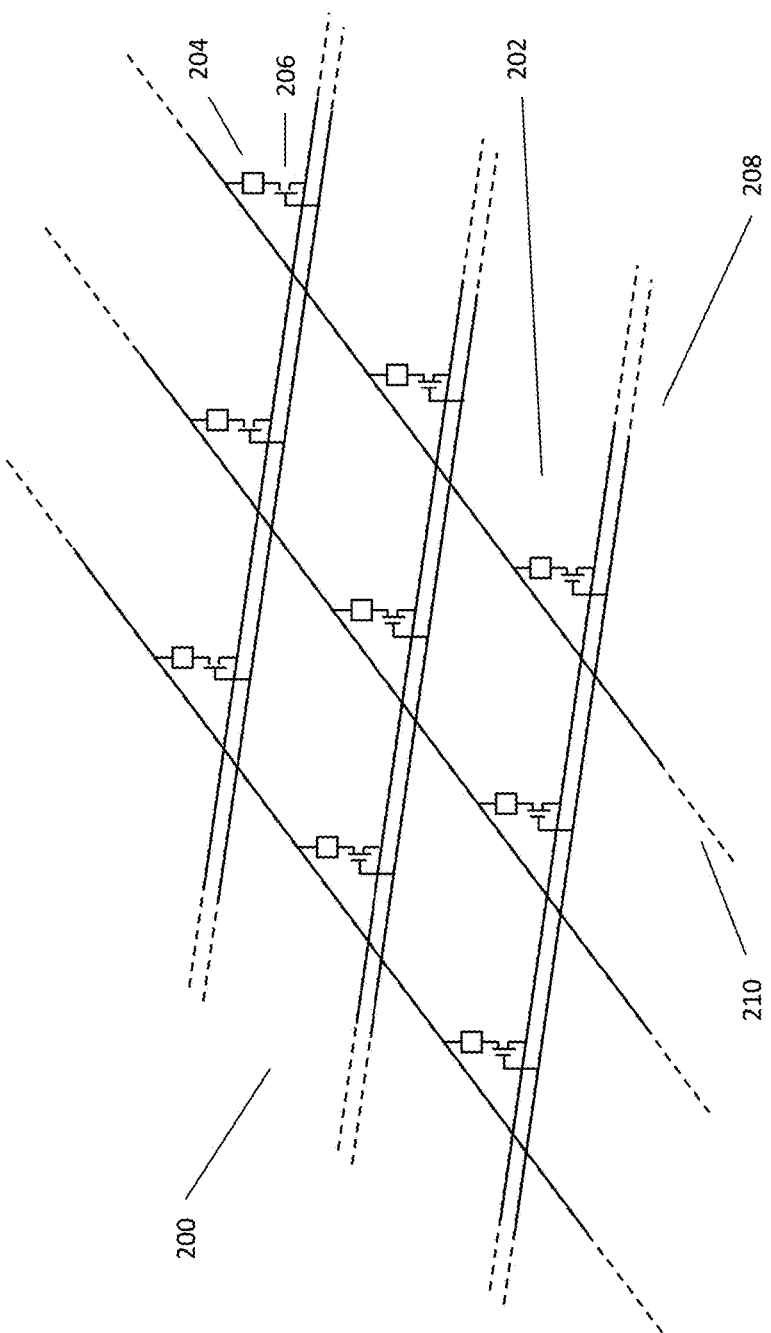
FIGS. 2A-2B illustrate a crossbar memory system utilizing conventional transistors as constituent select devices.
Figure 2B:
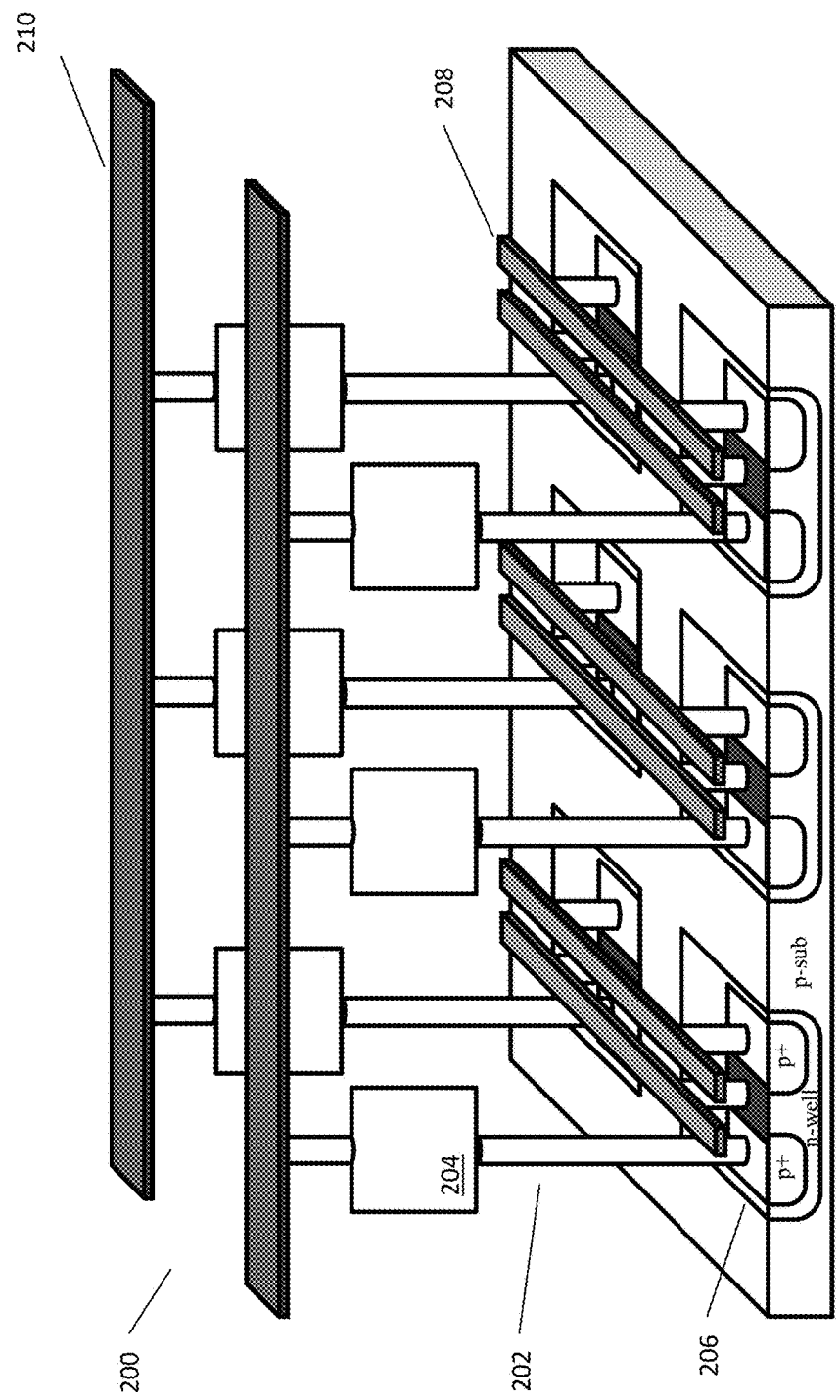

Similarly, FIGS. 2A-2B illustrate a crossbar memory system that utilizes conventional select devices in the form of field-effect transistors. In particular, FIG. 2A schematically illustrates that the crossbar memory architecture 200 includes an array of memory cells 202, each memory cell including a constituent memory device 204 and a constituent select device 206. In the illustrated case, the select devices 206 are conventional transistors. It is further illustrated that the crossbar memory architecture includes a first set of connection lines 208 and a second set of connection lines 210 that are perpendicularly disposed; the memory cells 202 are located at the intersection of the perpendicularly disposed connection lines, 208 and 210. In this way, each memory cell can be independently operated via a unique combination of respective connection lines. FIG. 2B depicts the crossbar memory system schematically illustrated in FIG. 2A. More particularly, FIG. 2B illustrates that the field-effect transistors 206 seen in FIG. 2A are conventionally-implemented PMOS transistors.

While such conventional crossbar memory systems have been effective in practicably providing memory storage, their overall efficacy is hampered by some shortcomings. For example, because of conventional manufacturing limitations, select devices are commonly fabricated during front end of line (FEOL) processes; the corresponding memory devices are typically patterned during back end of line (BEOL) processes. In other words, conventional manufacturing methods do not particularly lend themselves to fabricating select devices during BEOL processes. This can limit manufacturing versatility. Moreover, this limitation can hinder the ability to practicably implement stacked crossbar memory systems. As a result, crossbar memory systems are currently principally limited to planar configurations.

Recently, 2D materials have been explored for their ability to implement fundamental electronics components (e.g. p-n junctions and transistors). Within the context of the instant application, 2D materials can be understood to be monolayer or multilayer—usually less than or equal to approximately three layers—crystalline structures. Note that within the pertinent technical field, 2D materials are sometimes referred to as including up to a "few" layers of crystalline structures. As alluded to previously 'few' generally refers to no more than three layers (but can be more based on the context of the situation). In general, within the context of a 2D material, the atoms within a constituent layer are bonded strongly together (e.g. via a covalent bond), and any plurality of layers are held together by relatively weaker bonds (e.g. van der Waals forces). Relatedly, layered combinations of different 2D materials—referred to as van der Waals heterostructures within the context of the instant application—have also been explored for their ability to implement fundamental electronics components. As the name implies, the constituent 2D materials within a van der Waals heterostructure are typically held together by van der Waals and van der Waals-like forces (by contrast, to be clear, atoms within constituent layers are typically held together by much stronger forces, e.g. covalent bonds). 2D materials and Van der Waals heterostructures are discussed in, e.g.: "Van der Waals heterostructures," *Nature*, 25 Jul. 2013, 499, 419-525; "Progress, Challenges, and Opportunities in Two-Dimensional Materials Beyond Graphene," *ACS Nano*, 2013, Vol. 7, No. 4, pgs. 2898-2926; and "Integrated Circuits Based on Bilayer $MoS_2$ Transistors", *Nano Letters*, 2012, 12, pgs. 4674-4680. The disclosures of these cited references are hereby incorporated by reference in their entirety, especially as they pertain to 2D materials and van der Waals heterostructures.

Notwithstanding the many developments that have occurred with respect to 2D materials and van der Waals heterostructures, their potential has yet to be fully explored. The instant application discloses the implementation of select devices made from 2D materials, and how such configurations can substantially enhance the efficacy of crossbar memory systems. For instance, select devices made from 2D materials are not necessarily limited to having to be fabricated during FEOL processes; rather they can be fabricated during BEOL processes. Relatedly, this makes the manufacture of stacked crossbar memory systems viable; stacked crossbar memory systems can vastly improve memory storage per unit volume. Note that within the context of the instant application, the phrases 'made from 2D materials' and 'constructed from 2D materials' (along with any similar such phrases) are intended to encompass van der Waals heterostructures. In other words, a select device that is made from a van der Waals heterostructure can be characterized as being made from a 2D material, or made from 2D materials. Similarly, a select device that comprises a van der Waals heterostructure can be characterized as comprising 2D materials.

Crossbar memory systems that implement select devices constructed from 2D materials are now discussed in greater detail below.

Crossbar Memory Systems that Utilize Select Devices Made from 2D Materials

In many embodiments of the invention, crossbar memory systems are implemented that utilize select devices made from 2D materials. In many embodiments, the 2D materials are implemented in the form of van der Waals heterostructures. As mentioned above, select devices made from such materials can greatly enhance the versatility and efficacy of crossbar memory systems. Notably, embodiments of the invention are not constrained to the implementation of any particular 2D materials; rather select devices can be implemented via any suitable 2D material, or any suitable combination of 2D materials (e.g. in the case of van der Waals heterostructures), in accordance with many embodiments of the invention. For instance, in a number of embodiments, the implemented select devices are fabricated from one of the following 2D materials: graphene, $MoO_3$, $WO_3$, $MoS_2$, $MoSe_2$, $WS_2$, and $WSe_2$, and combinations thereof. To be clear, any suitable 2D material can be implemented in accordance with many embodiments of the invention, including any suitable transition-metal dichalcogenides. Candidate 2D materials are described in "An atlas of two-dimensional materials", *Chem. Soc. Rev.*, 2014, 43, 6537, the disclosure of which is hereby incorporated by reference in its entirety, especially as it pertains to the description of 2D materials.

In many embodiments, the implemented 2D materials are based on the desired electronic, optical, and mechanical properties for the select devices to be utilized. For example, based on the particular constituent elements, 2D atomic crystals can vary widely in band gaps, electronic properties, optical properties, and mechanical properties. For instance, various van der Waals heterostructures have demonstrated band gaps ranging from 0 eV to greater than 5 eV. Moreover, these inherent properties can further be tuned, e.g. via modifying thickness, imposing an electric field, and/or imposing strain effects. Notably, it has been shown that transistors made from 2D materials can be naturally immune to the short-channel effect, which can be a dominant factor limiting the scaling and performance of conventionally implemented silicon-based MOSFETs. For example, in "On Monolayer MoS2 Field-Effect Transistors at the Scaling Limit," *IEEE Transactions on Electron Devices*, Vol. 60, No. 12, December 2013, Liu et al. compare the scaling limit of double-gate monolayer $MoS_2$ field effect transistor (FET) with a thin body Si FET. Liu et al. show that such 2D $MoS_2$ FETs can potentially scale down to a channel length of approximately 8 nm, while conventional Si MOSFETs can go down to a channel length of approximately 10 nm. The disclosure of "On Monolayer $MoS_2$ Field-Effect Transistors at the Scaling Limit" is hereby incorporated by reference in its entirety, especially as it pertains to the scaling down of 2D transistors. As 2D transistors can be made to be smaller, when they are used as constituent components of memory cells, they can allow the memory cells to be more densely distributed. In other words, the density of the distribution of memory cells that implement conventional diodes and transistors (e.g. formed using standard CMOS techniques) is generally limited by the short-channel effect; transistors implemented using 2D materials can be immune to the short-channel effect. Accordingly, in many embodiments, crossbar memory systems are implemented whereby the constituent memory cells include transistors that are made from 2D materials and are characterized potentially by very small channel lengths. For example, in many embodiments, transistor lengths are implemented that are characterized by channel lengths as small as approximately 8 nm. In this way, the memory cells can be more densely distributed relative to conventional crossbar memory systems and the respective configurations can thereby provide for much improved memory storage per unit volume.

Figure 3A:
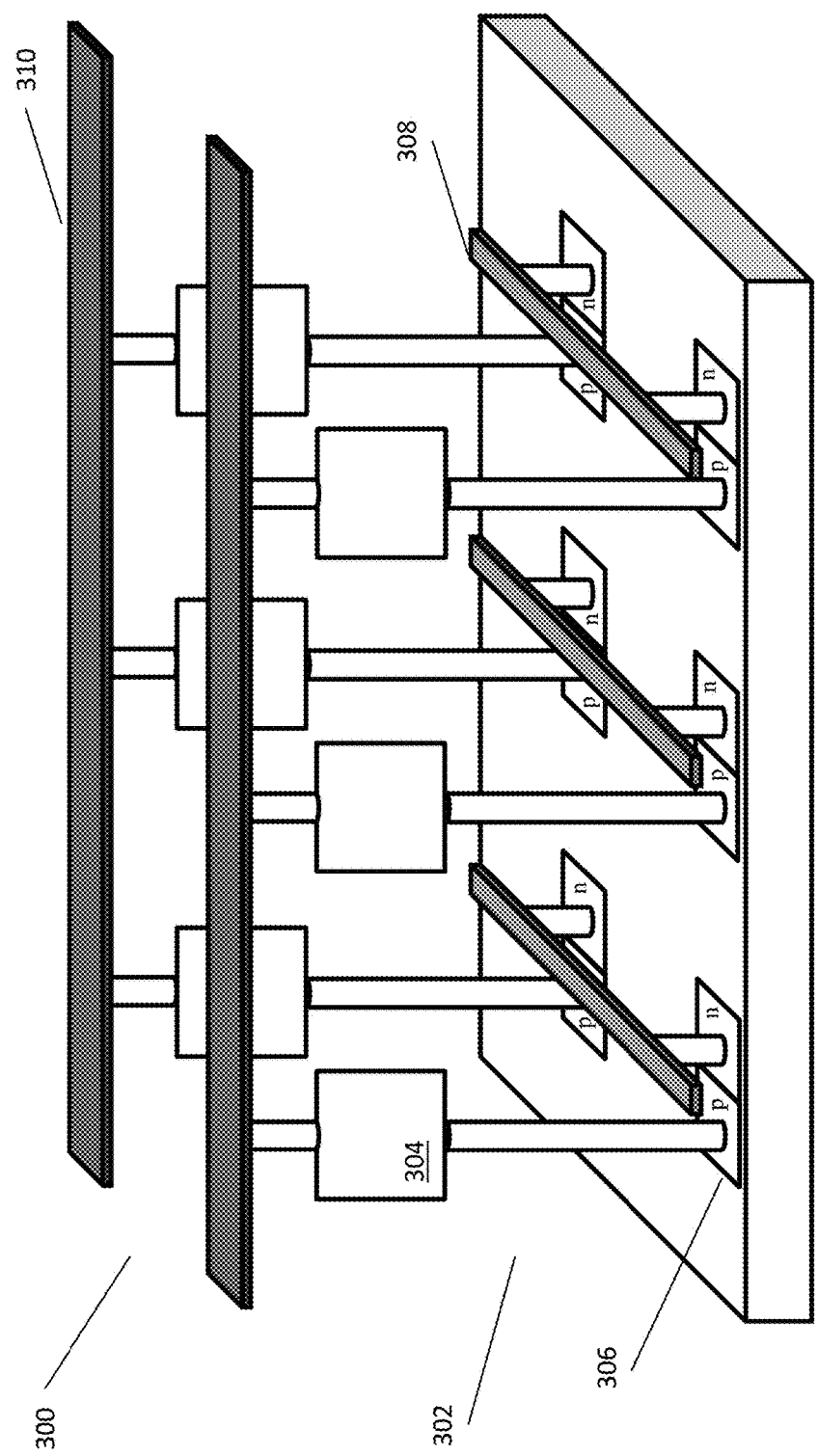
FIGS. 3A-3B illustrate a crossbar memory system utilizing diodes constructed from 2D materials as constituent select devices, as well as an example of a particular diode that can be implemented, in accordance with certain embodiments of the invention.

In one example, FIG. 3A illustrates a crossbar memory system utilizing p-n diodes realized via 2D materials as select devices in accordance with certain embodiments of the invention. In particular, it is illustrated that the crossbar memory system 300 includes memory cells 302, including constituent memory devices 304, and constituent select devices 306. More particularly, the constituent select devices 306 are p-n diodes implemented via 2D materials. Further, the memory cells 302 are each coupled to respective connecting lines 308 and 310. Note that p-n diode is conceptually similar to conventional p-n diodes—the difference being that the constituent component(s) are 2D materials (as opposed to bulk materials). Thus, a 2D p-n diode will have an n-type region and a p-type region, which will be separated by a depletion region.

Figure 3B:
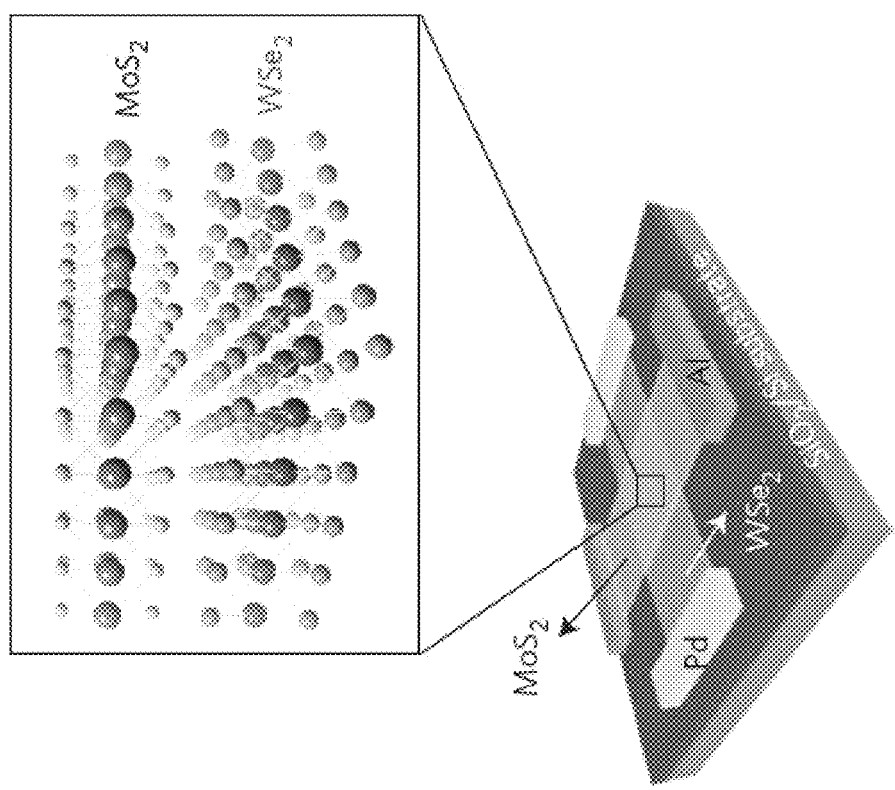

Importantly the p-n diodes can be implemented from 2D materials using any suitable technique in accordance with embodiments of the invention. For example, a candidate p-n junction is disclosed in "Atomically thin p-n junctions with van der Waals heterointerfaces", *Nature Nanotechnology*, 9, 676-681 (2014), the disclosure of which is hereby incorporated by reference in its entirety, especially as it pertains to the disclosure of a p-n junction made from 2D materials. In particular, "Atomically thin p-n junctions with van der Waals heterointerfaces discloses a p-n junction that includes individually contacted monolayers of p-type tungsten diselenide ($WSe_2$) and n-type molybdenum disulphide ($MoS_2$). FIG. 3B, extracted from "Atomically thin p-n junctions with van der Waals heterointerfaces", depicts this structure. Many embodiments of the invention include select devices that include p-n diodes that are implemented via contacted monolayers of p-type tungsten diselenide ($WSe_2$) and n-type molybdenum disulphide ($MoS_2$). Note that the layers can contact in any suitable way. In some embodiments, the layers are disposed one on top of the other (as is disclosed in "Atomically thin p-n junctions with van der Waals heterointerfaces"). In several embodiments, the layers are adjacently disposed, such that the edges are contacting (akin to the structure seen in FIG. 3A).

Note that the memory devices can be any suitable memory devices in accordance with embodiments of the invention. For example, the implemented memory devices can be one of: resistive random-access memory (ReRAM); spin-transfer-torque random-access-memory (STT-RAM); and magneto-electric random access memory (MeRAM) MeRAM configurations are discussed in U.S. Pat. Nos. 8,841,739, and 9,099,641, the disclosures of which are hereby incorporated by reference. To be clear, select devices can be used in conjunction with any suitable memory device in accordance with embodiments of the invention, including but not limited to, ReRAM, STT-RAM, and MeRAM.

Notably, as can be appreciated from the above-discussion, the p-n diodes can be constructed from any suitable 2D materials in accordance with embodiments of the invention. In many embodiments, the particularly implemented 2D materials are based on the desired band gap, electronic characteristics, optical characteristics, and/or mechanical characteristics. Moreover, although p-n Diodes have been illustrated and discussed in relation to FIGS. 3A-3B (and although a specific example has been given), it should be made clear that any suitable diodes constructed from 2D materials can be implemented in accordance with embodiments of the invention. For example, in many embodiments, Schottky diodes made from 2D materials are implemented. More generally, any suitable select devices that are realized via the implementation of 2D materials can be implemented in accordance with embodiments of the invention.

Figure 4A:
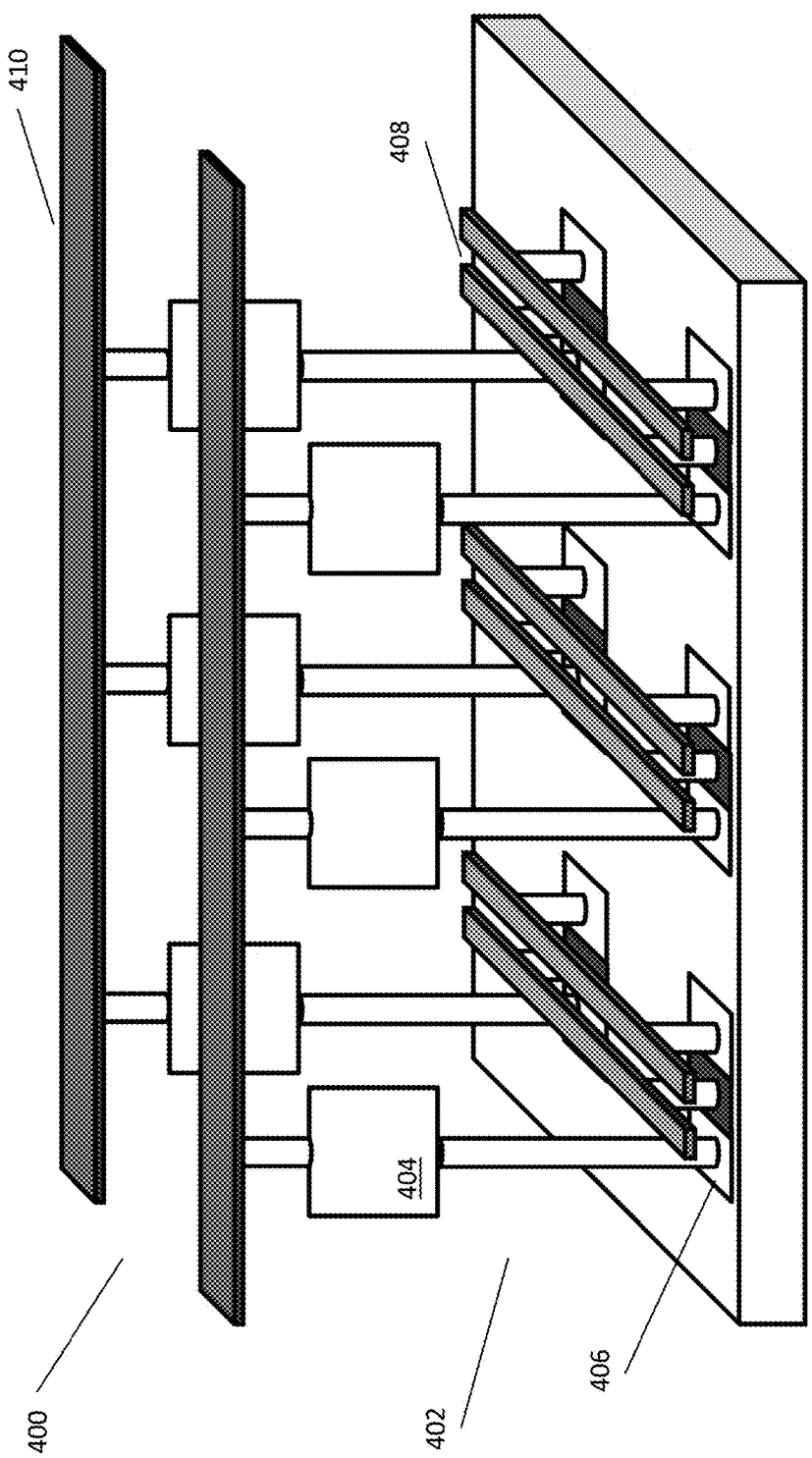
FIGS. 4A-4B illustrate a crossbar memory system utilizing transistors constructed from 2D materials as constituent select devices, as well as an example of a particular transistor that can be implemented, in accordance with certain embodiments of the invention.

As another example, FIG. 4A illustrates a crossbar memory system implementing transistors realized from 2D materials as select devices in accordance with certain embodiments of the invention. In particular, it is illustrated that the crossbar memory system 400 includes memory cells 402, including constituent memory devices 404, and constituent select devices 406. More particularly, the constituent select devices 406 are transistors made from 2D materials. Further, the memory cells 402 are each coupled to respective connecting lines 408 and 410. Note that the 2D transistor is conceptually similar to a conventional transistor—the difference being that the constituent components are 2D materials (as opposed to bulk materials). Thus, a 2D transistor can have a 'channel' region (e.g. an n-channel or a p-channel), and associated source/drain regions. Typically, the source/drain regions have associated metallic contacts, while a 'gate' is separated from channel region by a dielectric layer. Within the context of the instant application, it is not necessary that the associated metallic contacts, the gate, and the dielectric layer be 2D materials.

Figure 4B:
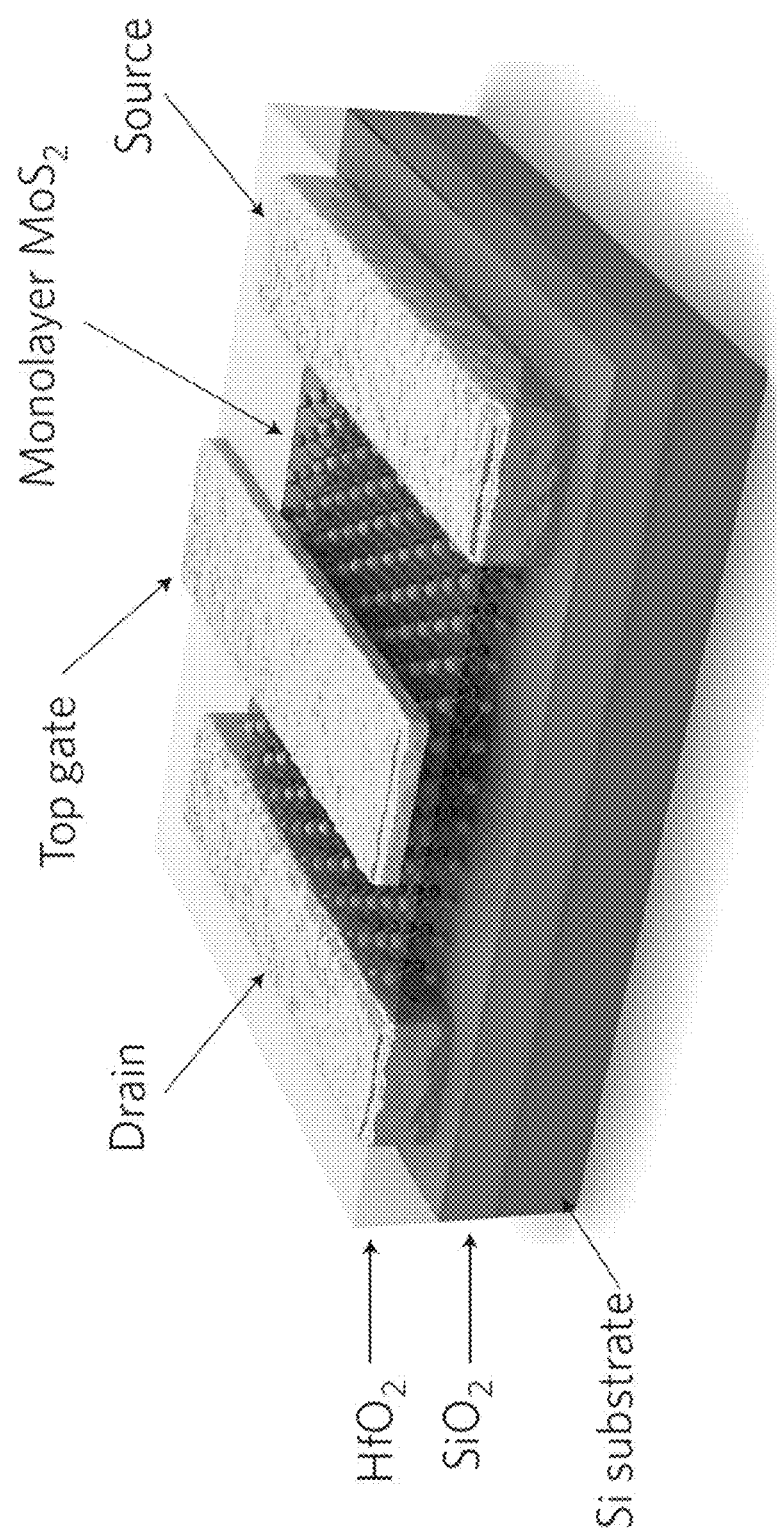

As before, any suitable memory device can be implemented in accordance with many embodiments of the invention (including e.g. ReRAM, STT-RAM, and MeRAM). Notably, as can be appreciated from the above-discussion, the transistors can be constructed and achieved using any suitable 2D materials in accordance with embodiments of the invention. For example, suitable transistors that can be implemented are described in: "Single-layer MoS₂ transistors", *Nature Nanotechnology*, 6, 147-150 (2011); and "Integrated Circuits Based on Bilayer MoS₂ Transistors", *Nano Lett.*, 2012, 12 (9), pp 4674-4680. The disclosures of these above-cited references are hereby incorporated by reference in their entirety, especially as they pertain to transistors that are implemented using 2D materials. FIG. 4B, extracted from "Single-layer MoS₂ transistors", depicts the structure that is the subject of the publication, and which can be implemented in select devices in accordance with embodiments of the invention.

In many embodiments, the particularly implemented 2D materials are based on the desired band gap, electronic characteristics, optical characteristics, and/or mechanical characteristics. Although a certain transistor structure is illustrated and discussed above in relation to FIG. 4A, it should be appreciated that any suitable transistors made from 2D materials can be implemented in accordance with embodiments of the invention.

Note that the fabrication of the disclosed structures is largely consistent with pre-existing crossbar memory system manufacturing techniques. As can be appreciated, the disclosed structures—including the described 2D select devices—can be implemented using any suitable manufacturing methods in conjunction with conventional crossbar memory manufacturing techniques. For example, in many instances exfoliation techniques are used to produce the 2D materials, which are layered into desired configurations. "Supporting Information" associated with "Integrated Circuits Based on Bilayer MoS₂ Transistors" (incorporated by reference above) describes the manufacturing used to implement the disclosed 2D transistors—such techniques can similarly be used to implement the structures described herein. For example, the "Supporting Information" generally discloses exfoliating MoS₂ thin films onto a substrate, and thereafter engaging in annealing steps, depositing steps, and patterning steps to derive the desired structure. The "Supporting Information" is herein incorporated by reference in its entirety, especially as it pertains to techniques for manufacturing Bilayer MoS₂ transistors. Of course, any suitable manufacturing technique can be used to implement the described structures, including any techniques disclosed in any of the above-cited reference.

As alluded to previously, select devices made from 2D materials do not necessarily have to be implemented during FEOL processes. In many instances, select devices constructed from 2D materials can be implemented during BEOL processes. Accordingly, this can enable the manufacture of stacked crossbar memory systems, which can provide more memory storage per unit volume. Thus, many embodiments of the invention are directed to stacked crossbar memory systems. Notably, stacked crossbar memory systems can be implemented in any suitable way in accordance with many embodiments of the invention. For instance, in many embodiments, stacked crossbar memory systems include at least one constituent planar crossbar memory sub-system that includes select devices made from 2D materials, and at least one constituent planar crossbar memory sub-system that includes conventionally implemented select devices. In numerous embodiments, a stacked crossbar memory system includes a plurality of constituent planar crossbar memory sub-systems that include select devices made from 2D materials, where the plurality of sub-systems are stacked on top of each other. Notably, any suitable number of constituent sub-systems can be stacked to create a stacked crossbar memory system in accordance with many embodiments of the invention.

Figure 5A:
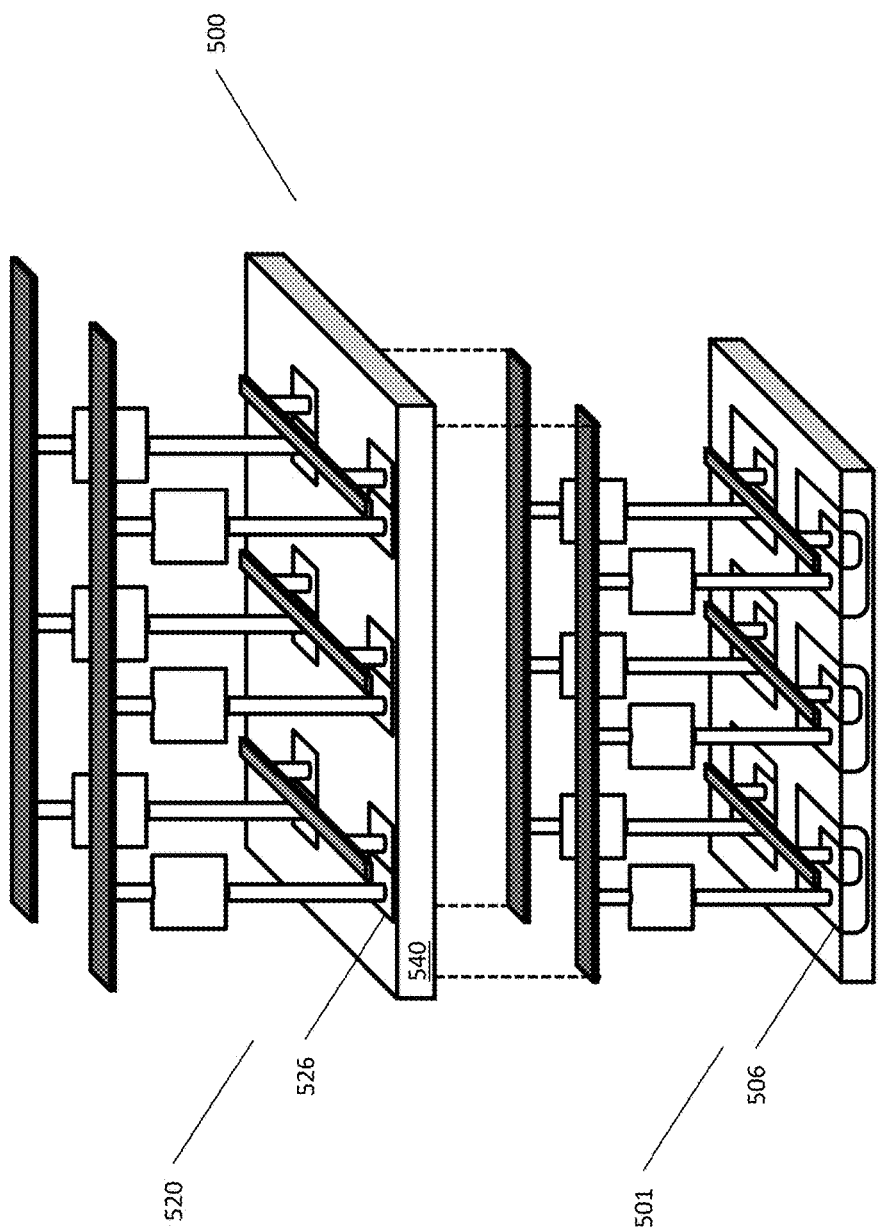
FIG. 5A illustrates a stacked crossbar memory system, including an upper constituent sub-system that includes select devices constructed from 2D materials and a lower constituent sub-system that includes conventionally constructed select devices, where the select devices are diodes in accordance with certain embodiments of the invention.

In one example, FIG. 5A illustrates a stacked crossbar memory system implementing p-n diodes as select devices. In particular, FIG. 5A depicts a stacked crossbar memory architecture 500 including two constituent planar crossbar memory sub-systems, each of which characterized by a crossbar memory architecture: an underlying planar crossbar memory sub-system 501 and an overlying crossbar memory sub-system 520. The underlying crossbar memory crossbar memory sub-system 501 is similar to the crossbar memory system seen in FIG. 1B insofar as it includes select devices 504 made according to conventional CMOS techniques. However, FIG. 5B further depicts that the stacked crossbar memory system 500 further includes an overlying planar crossbar memory sub-system 520. More particularly, the overlying planar crossbar memory sub-system is similar to the crossbar memory system seen in FIG. 3A insofar as it includes select devices 526 made from 2D materials. Importantly, the underlying planar crossbar memory configuration and the overlying planar crossbar memory configuration are separated by an insulation layer 540. In this way, the proper operation of the stacked crossbar memory system can be facilitated.

Figure 5B:
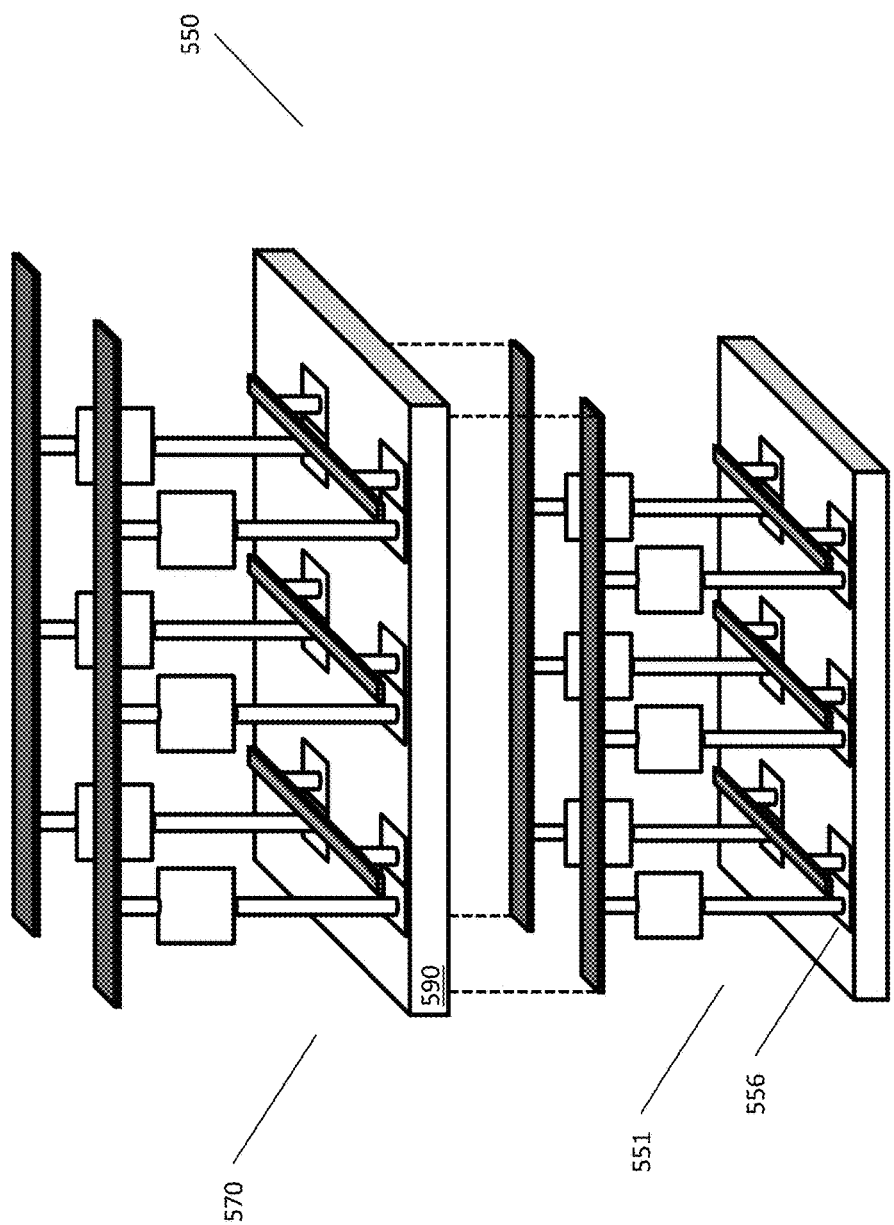
FIG. 5B illustrates a stacked crossbar memory system, including multiple constituent sub-systems that each include select devices constructed from 2D materials, where the select devices are diodes in accordance with certain embodiments of the invention.

While FIG. 5A depicts an underlying planar crossbar sub-system including select devices made according to conventional CMOS techniques, it should be clear that constituent planar crossbar memory sub-systems implementing select devices made using any suitable technique can be implemented in accordance with embodiments of the invention. Thus, for example, FIG. 5B illustrates a stacked crossbar memory architecture 550 including an underlying planar crossbar memory sub-system 551 having select devices 556 made from 2D materials in accordance with certain embodiments of the invention. As before, an insulating layer 590 is used to separate the overlying planar crossbar memory sub-system 570 from the underlying planar crossbar memory sub-system 551.

While the above examples have depicted stacked crossbar memory systems including two constituent planar crossbar memory sub-systems, it should be clear that embodiments of the invention can include any number of constituent planar crossbar memory sub-systems in accordance with embodiments of the invention. In other words, embodiments of the invention are not limited to stacked configurations including only two constituent planar crossbar memory sub-systems. For example, the described techniques can be implemented iteratively to create stacked crossbar memory systems including many constituent planar crossbar memory sub-systems in accordance with embodiments of the invention.

Figure 6A:
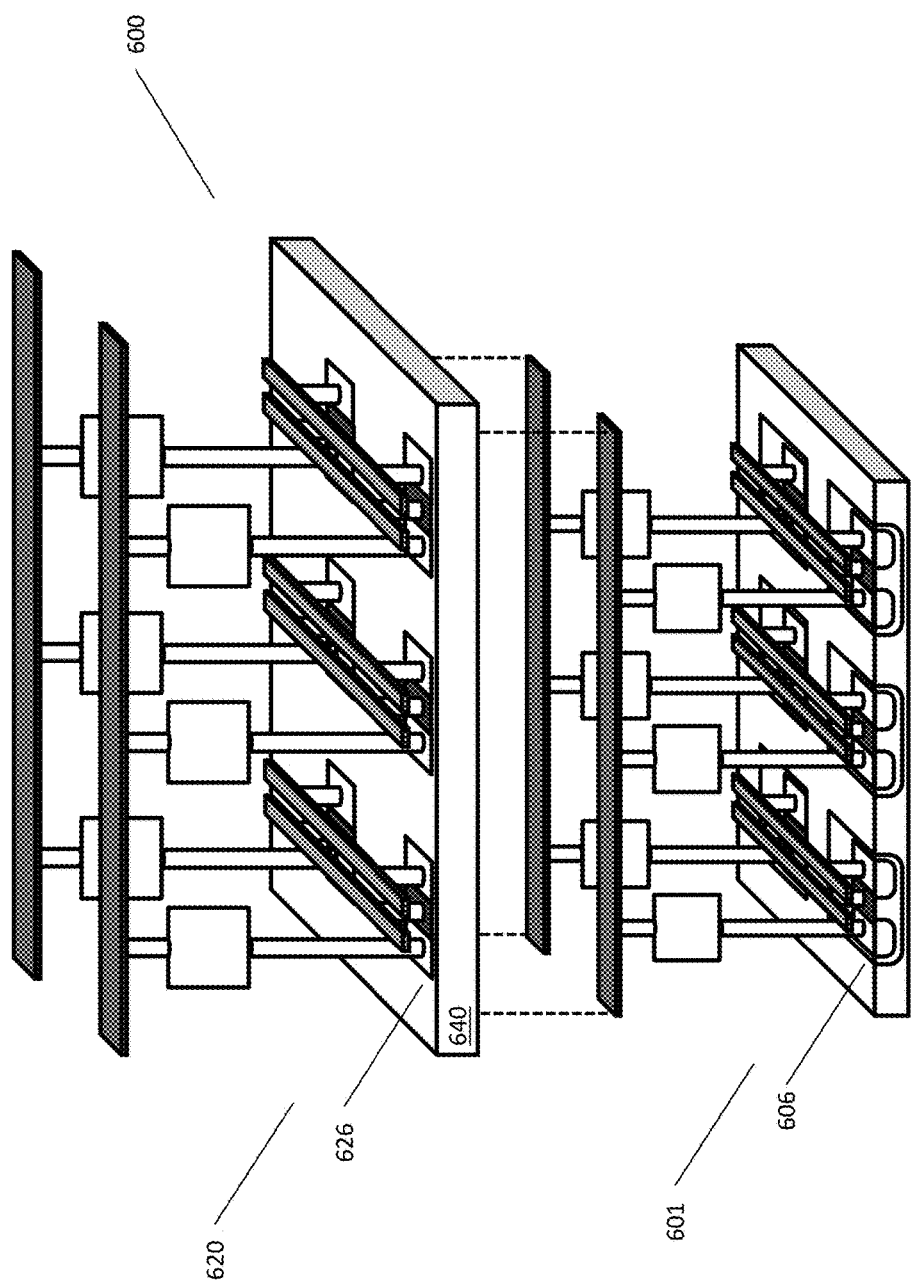
FIG. 6A illustrates a stacked crossbar memory system, including an upper constituent sub-system that includes select devices constructed from 2D materials and a lower constituent sub-system that includes conventionally constructed select devices, where the select devices are transistors in accordance with certain embodiments of the invention.
Figure 6B:
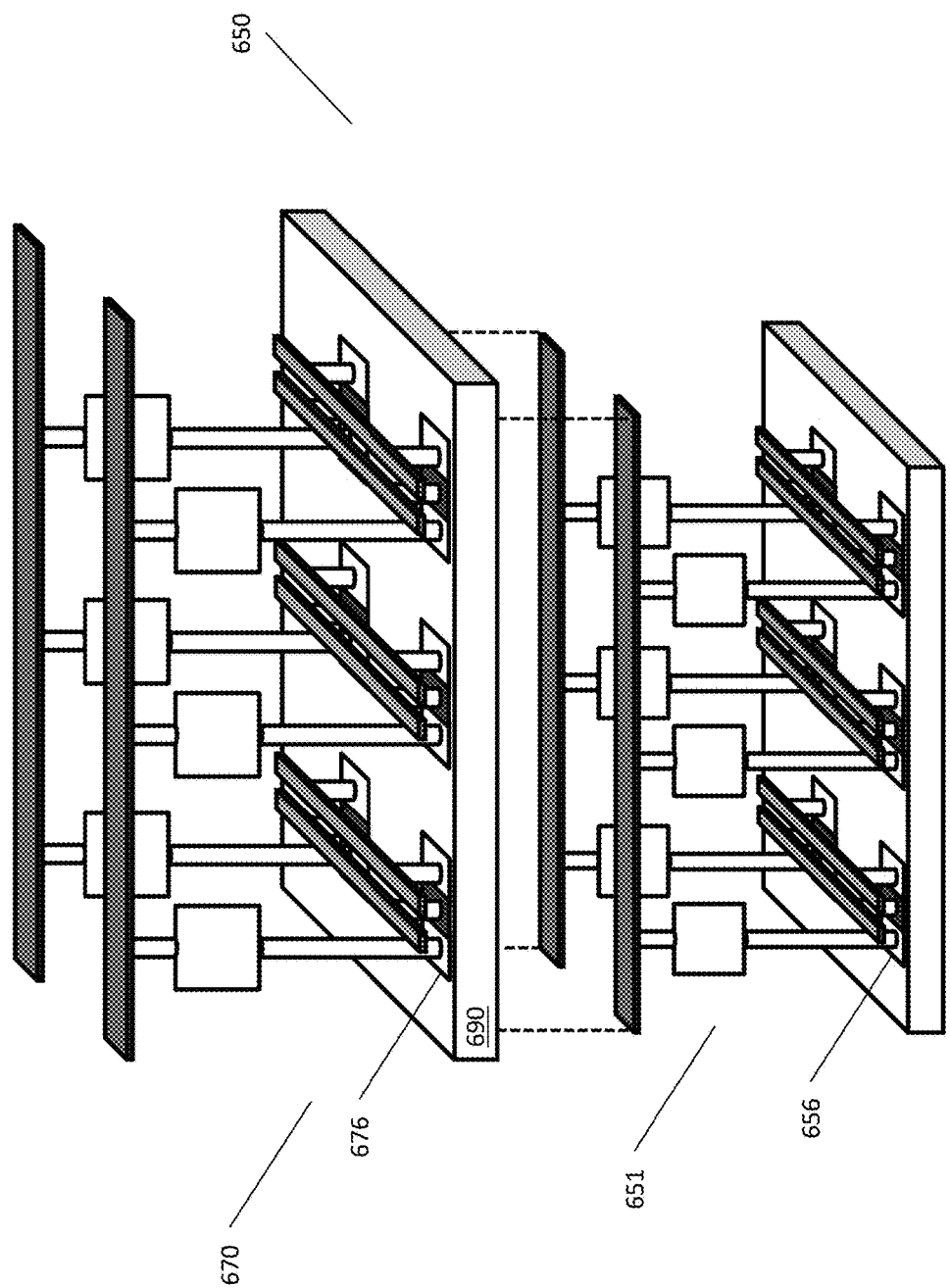
FIG. 6B illustrates a stacked crossbar memory system, including multiple constituent sub-systems that each include select devices constructed from 2D materials, where the select devices are transistors in accordance with certain embodiments of the invention.

Additionally, while the above examples have depicted stacked crossbar systems including select devices that are p-n diodes, in many embodiments, stacked crossbar systems include select devices that are transistors. Thus, for example, FIGS. 6A-6B depict stacked crossbar systems including select devices that are transistors. More specifically, FIG. 6A is similar to FIG. 5A insofar as it depicts a stacked crossbar memory system 600 including underlying 601 and overlying 620 planar crossbar memory sub-systems, separated by an insulation layer 640. However, FIG. 6A illustrates that select devices 606 and 626 are implemented in the form of transistors. More particularly, the select devices 606 of the underlying planar crossbar memory sub-system are implemented in the form of transistors made using conventional CMOS technologies; by contrast, the select devices 626 of the overlying planar crossbar memory sub-system are implemented using 2D materials.

As mentioned previously, in many instances, the stacked crossbar memory system includes multiple constituent planar crossbar memory sub-systems where select devices are made from 2D materials. Thus, FIG. 6B illustrates a stacked crossbar memory system including multiple constituent planar crossbar memory sub-systems implementing transistors made from 2D materials as select devices in accordance with certain embodiments of the invention. In particular, FIG. 6B is similar to FIG. 5B insofar as it depicts a stacked system 650 having both the underlying planar crossbar memory sub-system 651 and the overlying planar crossbar memory sub-system 670 implementing select devices 656 and 676 in the form of 2D materials. However, FIG. 6B illustrates that the select devices 656 and 676 are made transistors.

In general, as can be inferred from the above discussion, the above-mentioned concepts can be implemented in a variety of arrangements in accordance with embodiments of the invention. Accordingly, although the present invention has been described in certain specific aspects, many additional modifications and variations would be apparent to those skilled in the art. For example, while the above discussion has largely regarded the implementation of diodes and/or transistors as select devices, any suitable select device made from 2D materials can be implemented in accordance with embodiments of the invention. It is therefore to be understood that the present invention may be practiced otherwise than specifically described. Thus, embodiments of the present invention should be considered in all respects as illustrative and not restrictive.

What is claimed is:

1. A stacked crossbar memory system comprising:
a plurality of memory sub-systems and at least one insulation layer, wherein each insulation layer separates two of the plurality of memory sub-systems, wherein each memory sub-system comprises:
a first set of connection lines;
a second set of connection lines; and
an array of memory cells, each memory cell in the array comprising:
a select device; and
a memory device, wherein the memory device is one of: a spin-transfer torque random-access-memory device and a magneto-electric random-access-memory device;
wherein:
each memory cell in the array is coupled to a unique combination of one connection line in the first set of connection lines and one connection line in the second set of connection lines;
at least one of the select devices of the array of memory cells is crystalline; and
at least one of the select devices of the array of memory cells comprises a van der Waals heterostructure and thereby comprises a 2D material.

2. The stacked crossbar memory system of claim 1, wherein at least one of the select devices is a diode.

3. The stacked crossbar memory system of claim 2, wherein at least one of the select devices is a schottky diode.

4. The stacked crossbar memory system of claim 2, wherein at least one of the select devices is a p-n diode.

5. The stacked crossbar memory system of claim 4, wherein the p-n diode comprises a 2D material that is one of: graphene, $MoO_3$, $WO_3$, $MoS_2$, $MoSe_2$, $WS_2$, and $WSe_2$.

6. The stacked crossbar memory system of claim 4, wherein every select device within the crossbar memory system comprises a p-n diode.

7. The stacked crossbar memory system of claim 1, wherein the p-n diode comprises p-type $WSe_2$ and n-type $MoS_2$.

8. The stacked crossbar memory system of claim 1, wherein at least one of the select devices is a transistor.

9. The stacked crossbar memory system of claim 8, wherein the transistor comprises a 2D material that is one of: graphene, $MoO_3$, $WO_3$, $MoS_2$, $MoSe_2$, $WS_2$, and $WSe_2$.

10. The stacked crossbar memory system of claim 9, wherein the transistor comprises a 2D material that is $MoS_2$.

11. The stacked crossbar memory system of claim 8, wherein the transistor comprises a van der Waals heterostructure and thereby comprises a 2D material.

12. The stacked crossbar memory system of claim 8, wherein the transistor is immune to short-channel effects.

13. The stacked crossbar memory system of claim 8, wherein every select device within the crossbar memory system comprises a transistor.

14. The stacked crossbar memory system of claim 1, wherein the memory sub-systems are manufactured in a back-end-of-line process.

\* \* \* \* \*